United States Patent [19]

Muterspaugh

[11] Patent Number: 4,661,851
[45] Date of Patent: Apr. 28, 1987

[54] APPARATUS FOR REDUCING THE EFFECT OF NOISE INTERFERENCE IN AUDIO COMPANDING SYSTEM

[75] Inventor: Max W. Muterspaugh, Indianapolis, Ind.

[73] Assignee: RCA Corporation, Princeton, N.J.

[21] Appl. No.: 593,967

[22] Filed: Mar. 27, 1984

[51] Int. Cl.[4] .............................................. H04N 7/04
[52] U.S. Cl. .................................... 358/144; 381/106
[58] Field of Search ................ 358/144, 198; 381/106, 381/104, 94, 13; 333/14

[56] References Cited

U.S. PATENT DOCUMENTS 4,224,581  9/1980  Watanabe et al. ..................... 333/14
4,498,055  2/1985  Dolby .................................. 333/14

OTHER PUBLICATIONS

"Compandor Complexity Analyses" published by Broadcast Television Systems Committee of the Electronic Industries Association, Dec. 12, 1983, pp. 23–46.

Primary Examiner—James J. Groody
Assistant Examiner—David E. Harvey
Attorney, Agent, or Firm—P. J. Rasmussen; P. M. Emanuel; R. H. Kurdyla

[57] ABSTRACT

A companding system for a television audio apparatus includes a compressor and an expander for stereo difference or second audio program signals. The compressor provides variable preemphasis of high frequency signal components and the expander provides complementary variable deemphasis. Due to noise, the amount of deemphasis the expander can provide is limited. To ensure complementary operation of the compressor and expander a clamp means is used in the compressor to set the maximum amount of preemphasis. Similarly, in the expander, a clamp is used to set the maximum deemphasis of the compressor.

4 Claims, 10 Drawing Figures

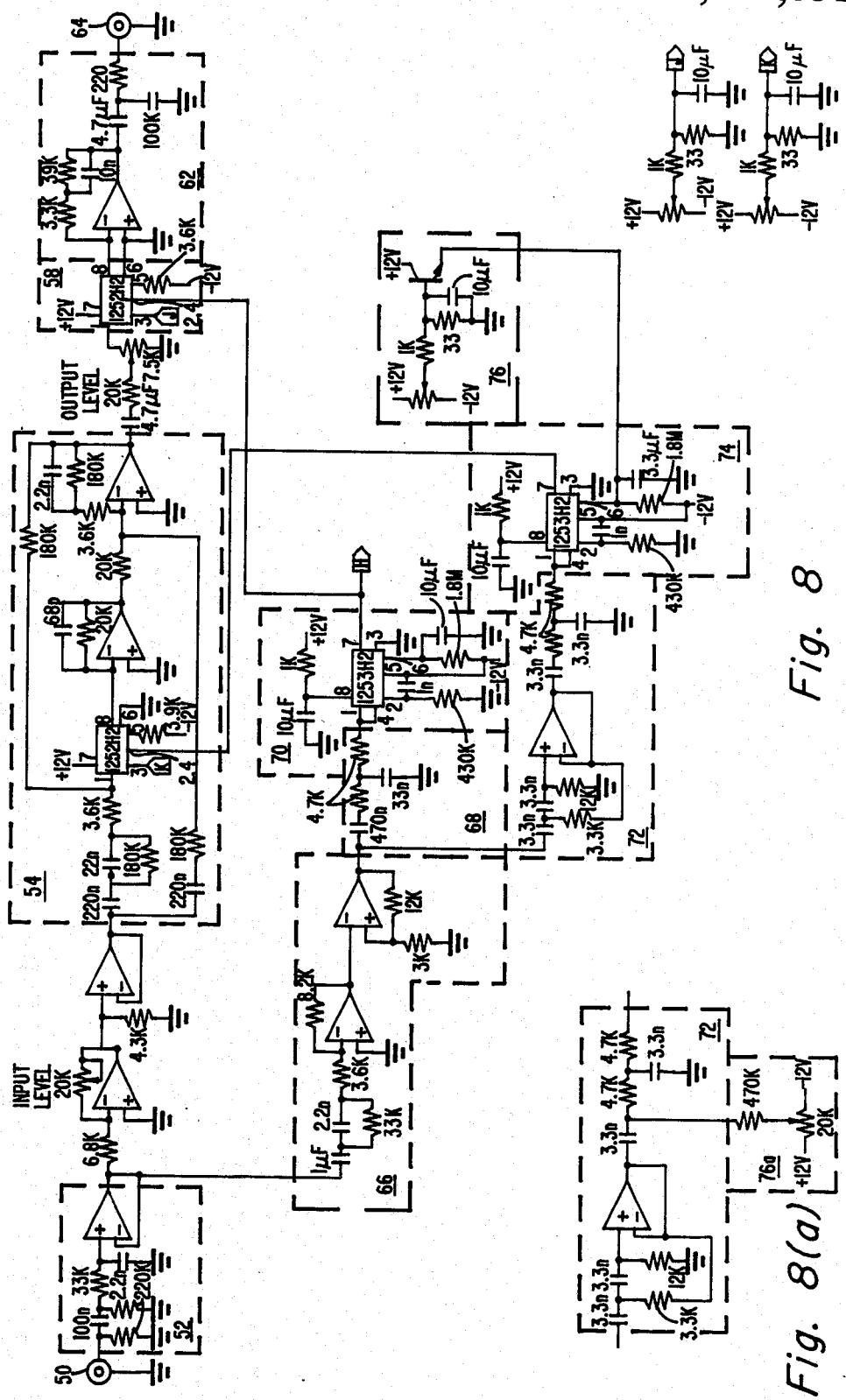
Fig. 8
Fig. 8(a)

APPARATUS FOR REDUCING THE EFFECT OF NOISE INTERFERENCE IN AUDIO COMPANDING SYSTEM

BACKGROUND OF THE INVENTION

The present invention relates to compander systems, and more particularly to such systems used for the transmission and reception of a multichannel sound signals.

It has been proposed to transmit a television signal having stereo audio components. An L−R difference signal to be transmitted, e.g., as an amplitude modulated (AM) suppressed carrier at, e.g., twice the horizontal scanning frequency. To maintain compatibility with existing monophonic (mono) receivers, the monaural signal, which consists of the L+R sum signal, is to be transmitted as a frequency modulated (FM) carrier in the conventional fashion. In a television receiver, the L+R and L−R signals are demodulated in a television receiver and then matrixed (added) to produce L and R signals. It has also been proposed to transmit an audio signal for a so called "second audio program" (SAP), e.g., for providing the main program in a second language, using, e.g., a frequency modulated carrier at four times the horizontal frequency.

For both the L−R and SAP signals it is also proposed to use a so called "dbx" companding system in which variable preemphasis (compression) of high frequency components at the transmitter and complementary deemphasis (expansion) at the receiver is used in order to improve the signal-to-noise (S/N) ratio of the corresponding reproduced signals. A companding system is not used for the L+R signal since, if it were, the ability of existing receivers to reproduce monaural signals would be disturbed. At any rate, the L+R signal is less subject to being contaminated by interference than the L−R or SAP signals because its carrier is at a much lower frequency. The "dbx" companding system is described in the publication entitled "Compandor Complexity Analyses" published by the Broadcast Television Systems Committee of the Electronic Industries Association. The purpose of providing substantial high frequency content in the transmitted signal is that it has been found that the greater the high frequency content of a transmitted signal the less perceptible will be noise (i.e., the more noise will be masked). Unfortunately, it has been found by the present inventor that due to the presence of noise under certain conditions, as will be explained below in detail, the deemphasis in the receiver will not match or be complementary to the preemphasis in the transmitter. Thus, the received audio signal will not be restored to its original level. In addition, the phase shifts caused by the preemphasis and deemphasis circuits will also no longer be complementary. In the case of stereo reproduction, this results in reduced stereo separation since the L−R and L+R signals when matrixed will not combine to produce the proper L and R signals.

SUMMARY OF THE INVENTION

In accordance with the present invention, in a compressor or expander with a variable filter circuit for either preemphasizing or deemphasizing signal components in a high frequency range, means are coupled to the variable filter circuit as by clamping its control signal to limit the amount of amplitude control the variable emphasis circuit provides at a predetermined level. Specifically at the transmitter, the preemphasis is limited and in the receiver the deemphasis is limited to the same degree as the preemphasis to maintain complementary companding system characteristics.

BRIEF DESCRIPTION OF THE DRAWINGS

FIG. 8 is a detailed schematic of an implementation of the expander as shown in FIG. 3; and FIG. 8(a) is a detailed schematic of a modification to the structure shown in FIG. 8 in order to implement the expander as shown in FIG. 4.

DETAILED DESCRIPTION OF THE DRAWINGS

Figures 1, 2:
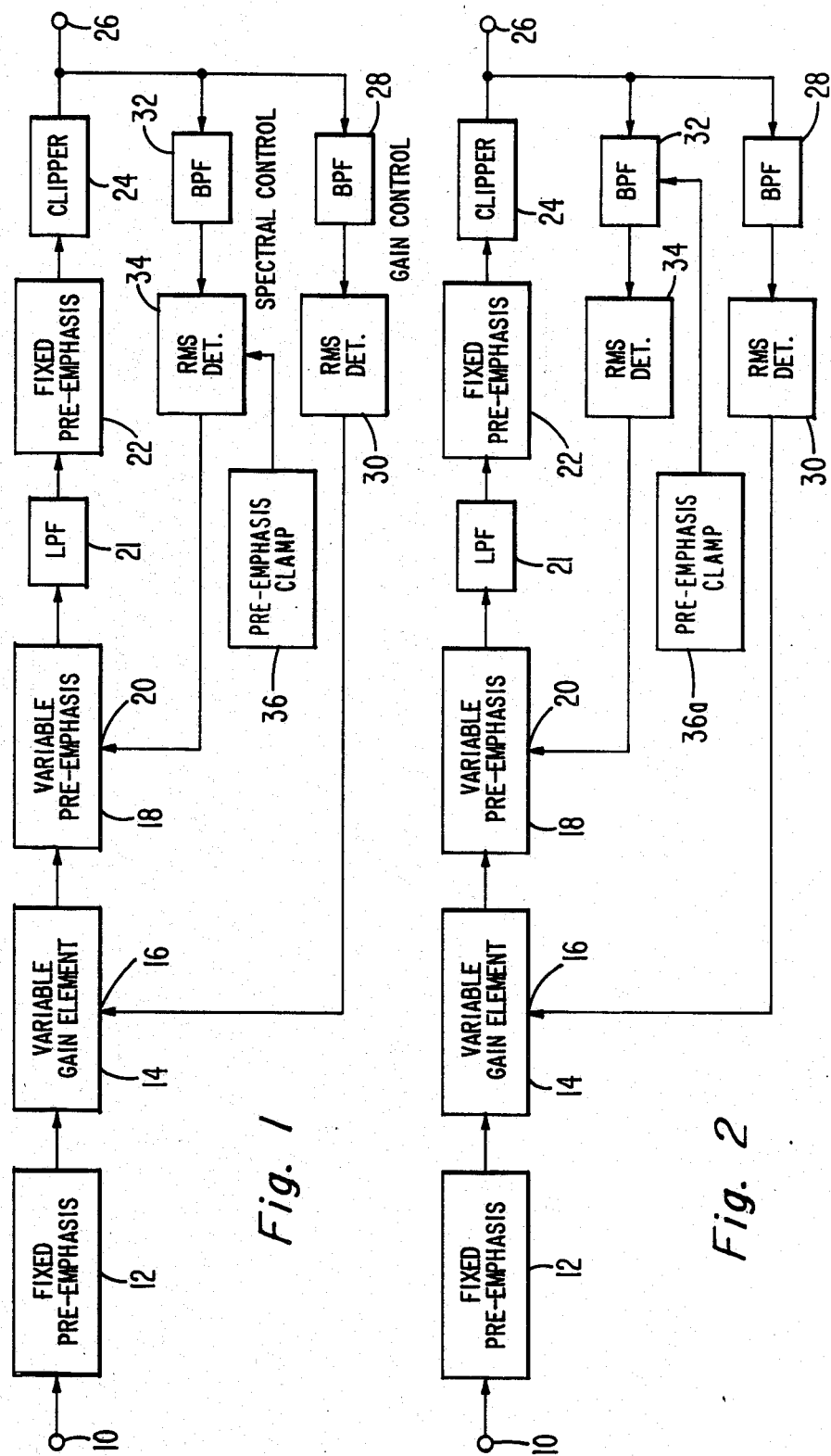
FIGS. 1 and 2 are block diagrams of first and second embodiments of compressors constructed in accordance with an aspect of the invention.

As shown in FIG. 1, input terminal 10 is provided to receive an audio signal, such as L−R or SAP audio signal to be compressed. The audio signal is applied to fixed preemphasis circuit 12 having a time constant of 390 $\mu$S (microseconds) which emphasizes signal components with frequencies above 408 Hz. The preemphasized signals from circuit 12 are applied to variable gain element 14 comprising a variable gain amplifier (VCA) and which has a gain control input 16. Amplifier 14 provides 2:1 wideband compression, e.g., an output signal with a 50 db dynamic range is provided in response to an input signal with a 100 db dynamic range. The compressed output signal of amplifier 14 is applied to a variable preemphasis circuit 18 which also includes a VCA and has a control input 20. Variable preemphasis circuit 18 has a time constant circuit of 390 $\mu$S and a gain control input 20 and varies the gain of high frequency signal components. Variable preemphasis circuit 18 in combination with fixed preemphasis circuit 12 provides a so-called "spectral control" function which is described in greater detail below. The output signal of circuit 18 is applied to lowpass filter (LPF) 21 having a 20 kHz cutoff frequency to prevent transmission of inaudable audio frequency signals. The filtered signal is applied to a fixed preemphasis circuit 22 having a time constant of 73.5 $\mu$S to preemphasize the signal for proper FM transmission. The output signal of circuit 22 is applied to clipper 24, which is set at a point equivalent of 100 percent modulation to prevent over modulation of the transmitted signal. The output signal at output terminal 26 is coupled to the transmission channel, e.g., by way of an AM modulator.

The output signal of clipper 24 is also applied to a gain control circuit including bandpass filter (BPF) 28 and root-means-square (RMS) detector 30. BPF 28 has a passband between 35 Hz to 2.09 kHz. Detector 30 provides a DC output signal to gain control input 16 of variable gain element 14 having a level related to the RMS value of the output signal level from BPF 28. The output signal of clipper 24 is also applied to a spectral control circuit comprising BPF 32 and RMS detector 34. BPF 32 has a passband between 8 kHz and 21 kHz. Detector 34 provides a DC output signal to gain control input 20 of variable preemphasis circuit 18 having a level related to the RMS value of the output signal level from BPF 32.

In accordance with the present invention and for reasons explained below, a clamp circuit 36 is coupled to detector 34 of the spectral control portion to limit the gain control voltage and thus, the amount of amplification provided by the VCA of variable preemphasis circuit 18. The implementation of clamp circuit 36 will be explained in detail with respect to FIG. 7.

FIG. 2, wherein elements corresponding to those of the embodiment of FIG. 1 have been given to corresponding reference numbers, shows an alternate embodiment of the invention. The arrangement is identical to that of FIG. 1 except clamp circuit 36a is coupled to BPF 32 so as to provide a predetermined bias to the input of RMS detector 34, as will be explained in detail with respect to FIG. 7a to limit the minimum signal level to which detector 34 responds and hence the gain control voltage it can generate. This limits the amplification of the VCA within variable preemphasis circuit 18.

Figure 3:
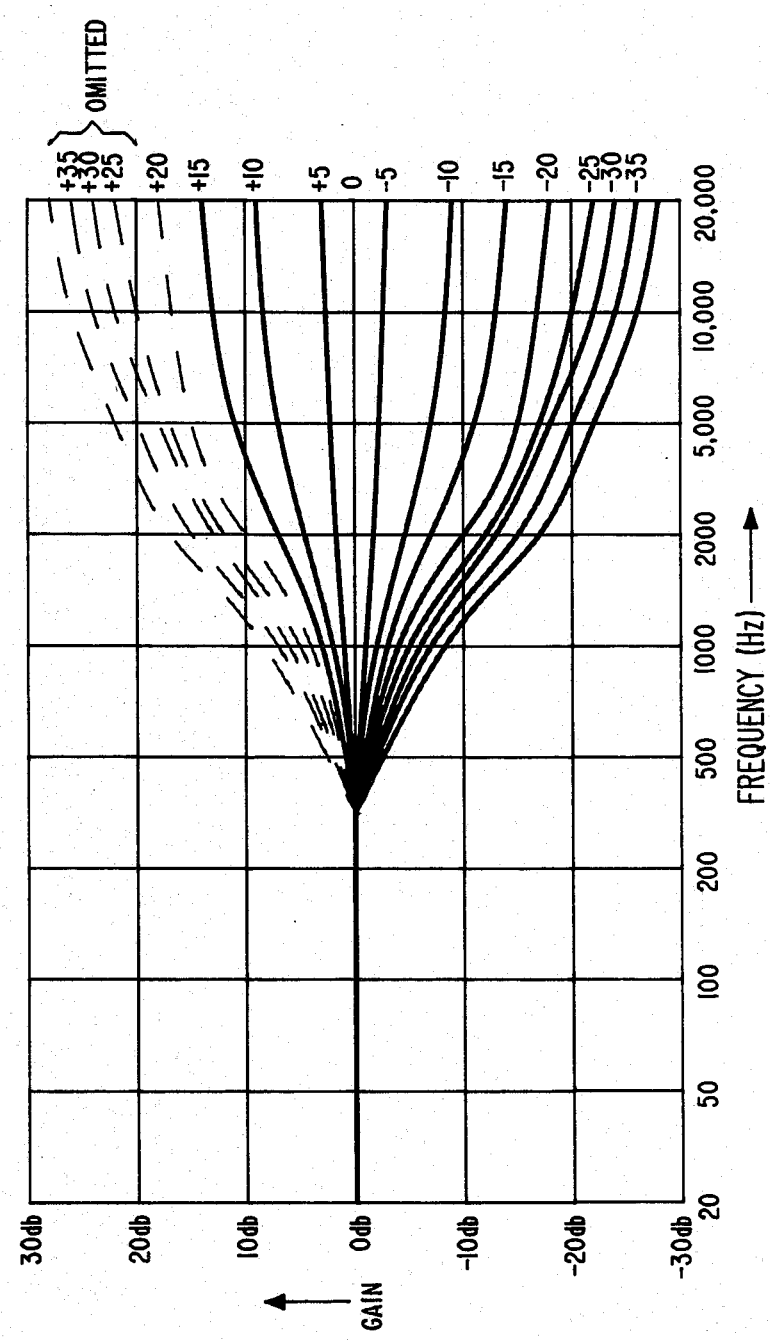
FIG. 3 is a graph of the compression characteristics of a portion of the compressors shown in FIGS. 1 and 2.

FIG. 3 is a graph illustrating the operation of variable preemphasis circuits 18 of FIGS. 1 and 2. Variable preemphasis circuit 18 provides amplification or attenuation of the output signal of fixed preemphasis circuit 12, depending on the signal level at the output of clipper 24, for the reasons explained below. In FIG. 3, the vertical axis corresponds to the gain of variable preemphasis circuit 18 and the horizontal axis corresponds to frequency. The curves represent the gain for various values of gain control voltage at gain control input 20. Without the present invention comprising clamp 36 or 36a, the high frequency gain range extends from about −35 db to +35 db. With the present invention, gains from +20 db to +35 db are not obtainable as indicated by the asymmetrical gain range.

The transmitter in which the compressor is included also includes an L+R channel. However, the L+R channel is not compressed so as not to disturb the reproduction of monaural signals in receivers as explained above.

Figure 4:
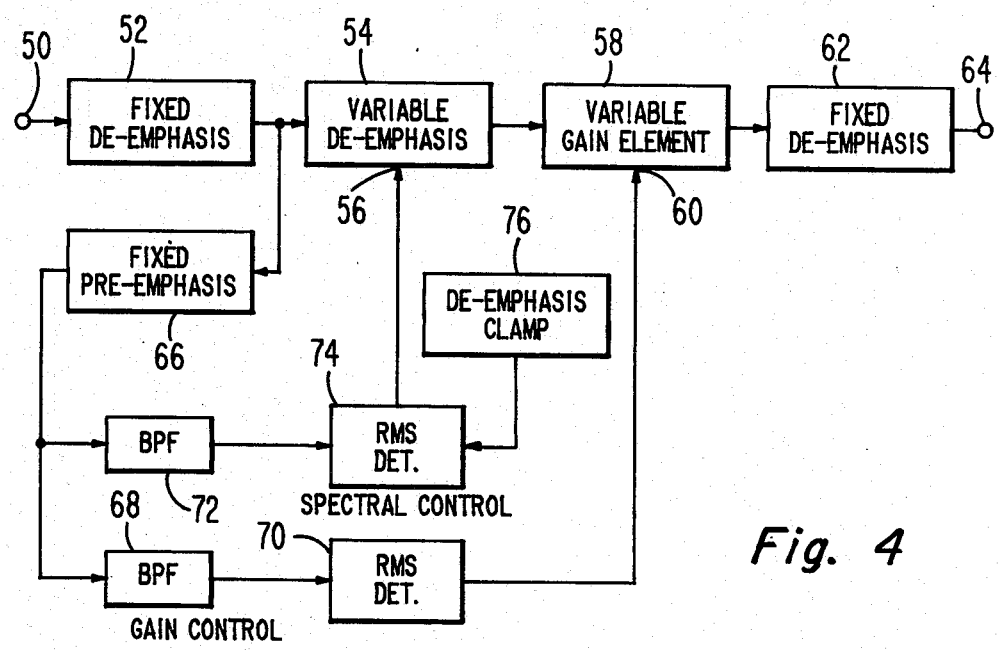
FIGS. 4 and 5 are block diagrams of first and second embodiments of expanders constructed in accordance with another aspect of the invention.

FIG. 4 shows a first embodiment of an expander constructed in accordance with a feature of the invention. A demodulated L−R or SAP audio signal is received at input terminal 50 and applied to fixed deemphasis circuit 52 having a time constant of 73.5 μS. Fixed deemphasis circuit 52 performs amplitude versus frequency shaping which is the complement of that provided by fixed preemphasis circuit 22 of the compressors shown in FIGS. 1 and 2. The output signal from circuit 52 is applied to variable deemphasis circuit 54 having a time constant of 390 μS. Variable deemphasis circuit 54 includes a VCA with an associated gain control input 56. Variable deemphasis circuit 54 restores the original balance between low and high frequencies that was changed by variable preemphasis circuit 18 of the compressors of FIGS. 1 and 2. The output signal of circuit 54 is applied to variable gain element 58 having a gain control input 60. Variable gain element 58 provides wideband expansion of the dynamic range of the signal by the same amount as it was compressed by variable gain element 14 of the compressor, e.g., by 1:2 so that a compressed 50 db dynamic range signal is expanded again to have a dynamic range of 100 db. The output signal of element 58 is applied to fixed deemphasis circuit 62 having a time constant of 390 μS and performs amplitude versus frequency shaping which is complementary to that of preemphasis circuit 12 of the compressors of FIGS. 1 and 2. The output signal from circuit 62 is available at output terminal 64 for further processing, e.g., matrixing if it is the L−R signal with the L+R signal (which is not processed in an expander) to form L and R signals.

The output signal of circuit 52 is also applied to fixed preemphasis circuit 66 having a time constant of 73.5 μS, its amplitude versus frequency response being the complement of that of deemphasis circuit 52 of the compressors shown in FIGS. 1 and 2. The output signal of circuit 66 is applied to a gain control circuit comprising BPF 68 having a passband from 35 Hz to 2.09 kHz and RMS detector 70. The output signal from detector 70 is a DC signal having a level related to the RMS value of the output signal from BPF 68 and is applied to gain control input 60 of variable gain element 58.

The output signal of preemphasis circuit 66 is also applied to a spectral control circuit comprising BPF 72 having a passband between 8 kHz and 21 kHz and an RMS detector 74 which generates a DC output signal with a level related to the RMS value of its input signal. This DC output signal is applied to gain control input 56 of variable deemphasis circuit 54.

In general, in a companding system, at the transmitter, weak signal portions are amplified by a greater amount than strong signal portions. At the receiver, the converse operation is performed so that the original dynamic range of the compressed audio signal is restored by attenuating the received signal in inverse relationship to its strength at the receiver. Thus, the noise introduced in the transmission channel is attenuated along with the audio signal and therefore made less perceptible. The wideband portion of the compressors shown in FIGS. 1 and 2 comprising variable gain element 16, BPF 28 and RMS detector 30 and the wideband portion of the expander shown in FIG. 4 comprising variable gain element 58, BPF 68 and RMS detector 70 are used for the above described purpose.

In the companding system, to further improve noise performance, a spectral compressor is used to provide relatively constant high amplitude high frequency content for transmitted signals since it has been found that noise is effectively masked under these conditions. To provide the desired level of high frequency content for strong high frequency audio signals, variable preemphasis circuit 18 has attenuation characteristics to compensate for the preemphasis provided by fixed preemphasis circuit 12.

So far described, for the moment ignoring the effect of clamping circuits 36 and 36a of the compressors shown in FIGS. 1 and 2, a problem can occur due to noise introduced in the transmission (i.e., broadcast) medium itself and also at the input of the compressor which prevents the complementary operation of the compressor and expander and thereby the proper reproduction of audio information.

To understand the problem caused by the introduction of noise in the transmission medium, consider the following conditions. Assume that there is relatively little high frequency (i.e., between 8 kHz and 15 kHz) program content and that there is a relatively large amount of noise introduced in the transmission medium.

Because of the low amplitude high frequency content of the program, variable preemphasis circuit 18 of the compressor will provide nearly maximum preemphasis which corresponds to an amplification of nearly +30 db. Idealy, variable deemphasis circuit 58 of the expander structure shown in FIG. 4 should provide nearly maximum deemphasis which corresponds to an attenuation of nearly −30 db. However, due to the presence of noise, which passes through relatively broad BPF 72 of the expander, the expander operates as if the program actually contained a significant amount of high frequency content and, therefore, will not provide as much deemphasis as it should (i.e., it does not recognize that the program actually contained nearly no high frequency content). Therefore, there will not be complementary operation as to both amplitude and phase shift of the compressor and expander. The L+R and L−R signals must have the same phase shifts and also the same L and R amplitude components so that when they are matrixed, they provide pure L and R signals. Non-complementary operation of the companding system prevents the latter condition. Accordingly, in the reproduction of stereo there will be less than desirable stereo separation.

To understand the problem caused by the introduction of noise at the input of the compressor structures shown in FIGS. 1 and 2 consider the following. Noise is unavoidably present at the input of the compressor. If it is low level noise, it will be preemphasized by variable preemphasis circuit 18 to nearly the +30 db level and transmitted along with the processed audio signal. Theoretically, the latter combination will be detected and then deemphasized to the same degree that it was preemphasized in the transmitter. Unfortunately, the detected signal may not contain the same noise component as that transmitted, e.g., due to differing filter characteristics in the expander and compressor (because of the practical limitations of filter design). Therefore, RMS detector 74 of the expander structure will not produce the proper control signal for deemphasizing the previously preemphasized signal in complementary fashion. Again, in the case of stereo reproduction, this results in the loss of stereo separation.

Figure 5:
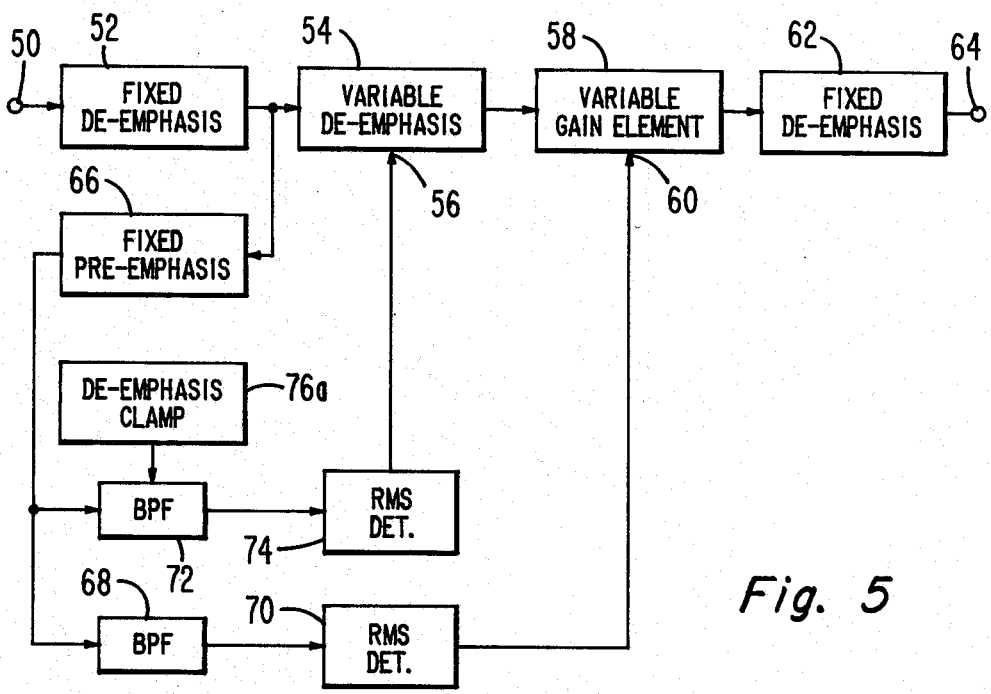

The problem resulting from both above-described causes can be reduced by limiting the amount of preemphasis in the compressor of the transmitter to a predetermined limit, e.g., +20 db, as is indicated by the asymmetrical characteristic shown in FIG. 3. This is accomplished by clamp circuit 36 and 36a shown in FIGS. 1 and 2, respectively. To ensure complementary operation in the expander of the receiver, clamp circuit 76, similar to clamp circuit 36 of the compressor shown in FIG. 1, is added as shown in FIG. 4 to limit the deemphasis to a predetermined limit, e.g., −20 db, corresponding to the preemphasis limit of the compressor. Alternatively, clamp circuit 76a similar to clamp circuit 36a of the compressor shown in FIG. 2, is added to the expander as shown in FIG. 5 (where the same elements shown in FIG. 4 have the same reference numbers). The effect of clamp circuits in the expanders shown in FIGS. 4 and 5 is indicated by the asymmetrical gain versus frequency characteristics of variable deemphasis circuit 54 shown in FIG. 6.

Figure 6:
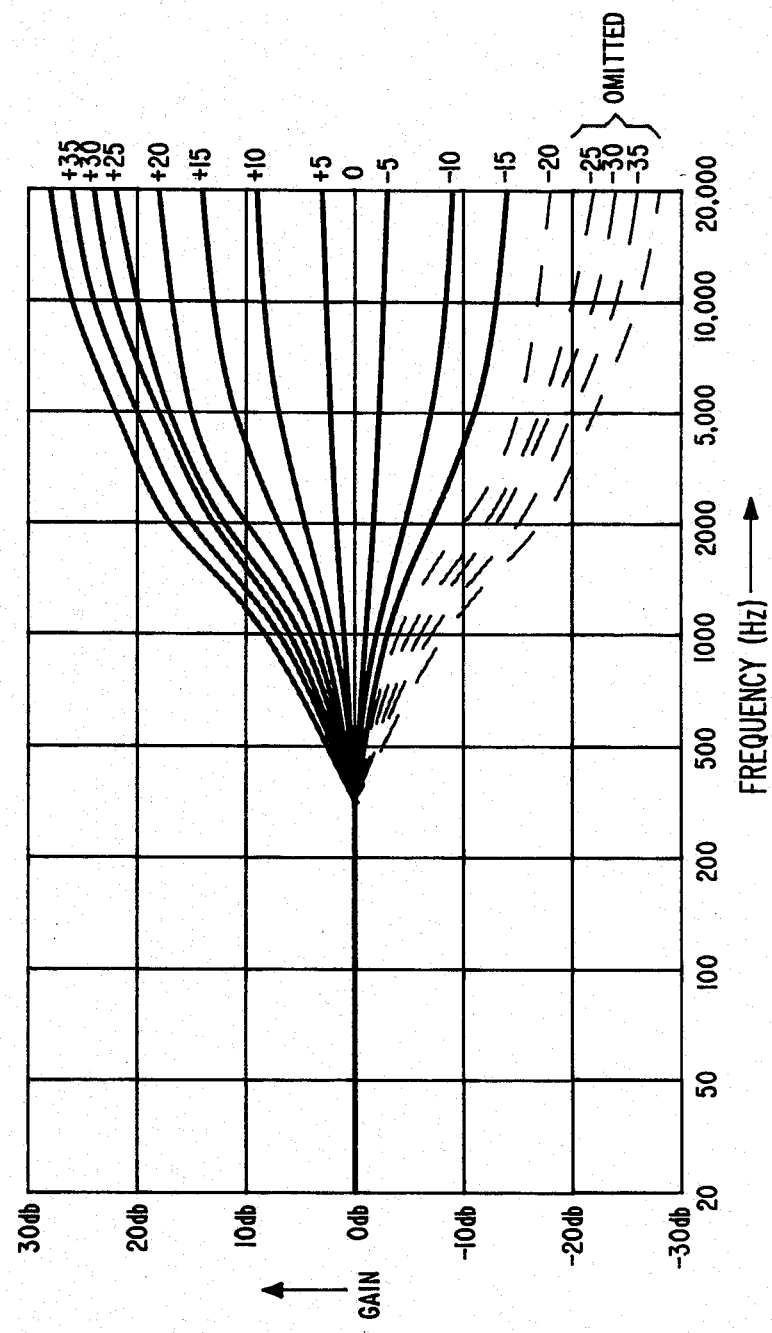
FIG. 6 is a graph of the expansion characteristics of a portion of the expanders shown in FIGS. 3 and 4.

In FIG. 6, as indicated by the curves including those shown in phantom, in the prior art the gain/attenuation characteristics ranged from −35 db to +35 db. However, of FIG. 4 or clamp circuit 76a of FIG. 5 will be seen that due to clamp circuit 76, attenuations greater than 20 db are omitted, resulting in an asymmetrical range of −20 db to +35 db.

Because BPF 32 used in the control circuit of variable preemphasis circuit 18 of the spectral compressor shown in FIGS. 1 and 2 has a relatively large high frequency range, the spectral compressor is more prone to be actuated by noise than the wideband compressor including variable gain element 14 and BPF 28, which filter a relatively low frequency cutoff of 2 kHz. Thus, it has been found that no clamp is needed in the control circuit of the wideband compressor.

In FIGS. 7, 7a, 8 and 8a, the letters $\mu$, n and d mean microfarad, nanofarad and picofarad, respectively.

Figures 7, 7A:
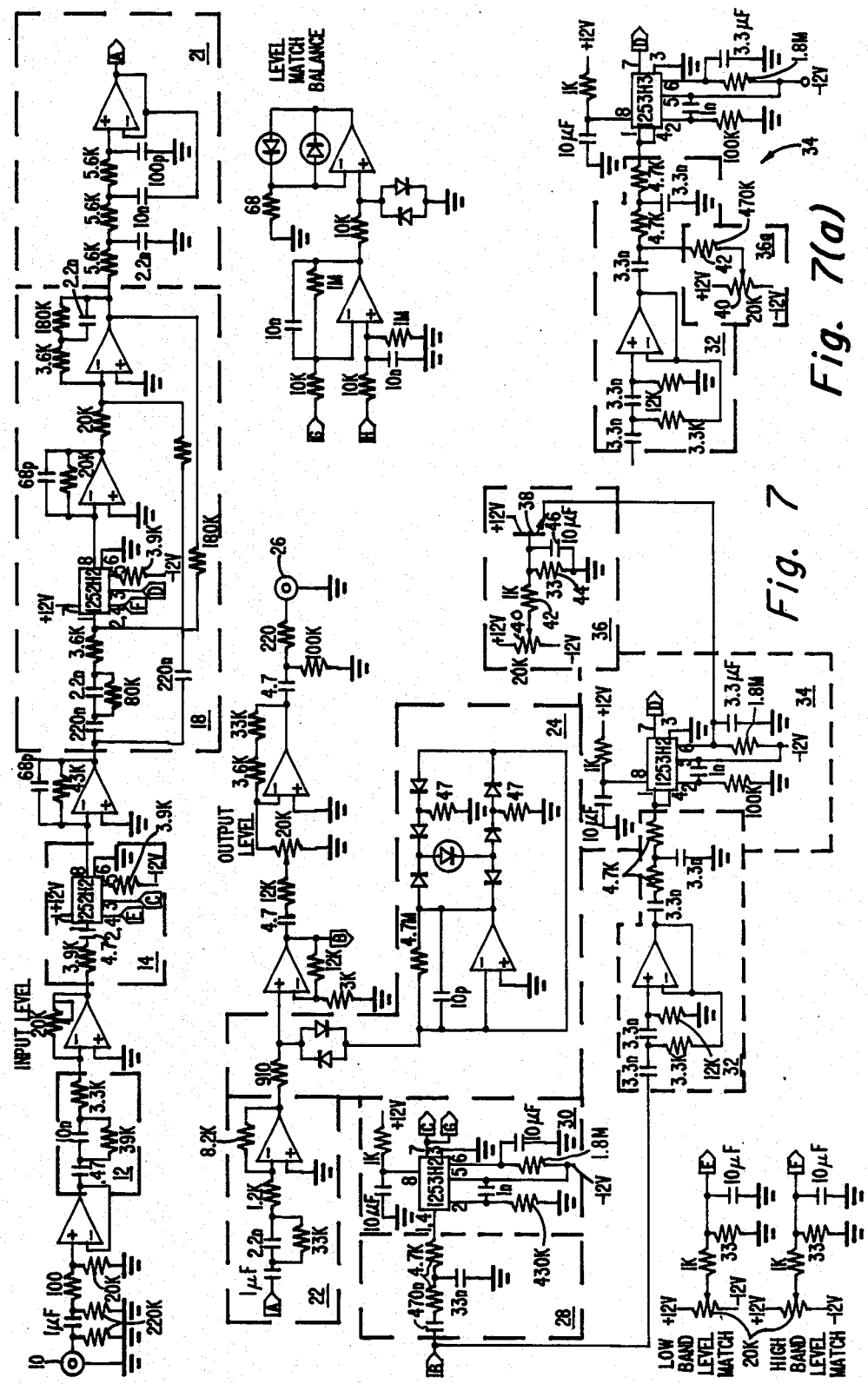
FIG. 7 is a detailed schematic of an implementation of the compressor shown in FIG. 1.
FIG. 7(a) is a detailed schematic of a modification to the structure shown in FIG. 7 in order to implement the compressor shown in FIG. 2.

FIG. 7 shows a detailed schematic drawing of the embodiment of FIG. 1. VCA 14 and the VCA in variable preemphasis circuit 18 comprise type 1252H2 integrated circuits available from Nippon Electric Co. (NEC) of Japan and have a logarithmic control function, (i.e., linear decibel gain changes are a function of the control voltage). RMS detectors 30 and 34 comprise type 1253H3 integrated circuits also available from NEC and provide DC control signals which are logarithmically related to the RMS value of their input signals.

Clamp circuit 36 coupled to RMS detector 34 includes a transistor 38, the emitter of which is coupled to detector 34, and the collector of which receives +12 volts. An adjustable bias circuit comprises adjustable potentiometer 40 receiving +12 volts and −12 volts at opposite ends thereof. Resistor 42 is coupled to the tap of potentiometer 40, while resistor 44 is coupled to resistor 42 and to ground. Resistors 42 and 44 form a voltage divider to reduce the adjustment range of potentiometer 40 to e.g., 0 to 1 volt, which is a sufficient range to apply to the base of transistor 38. Capacitor 46 is an audio bypass capacitor to prevent interference signals from being applied to the base.

In operation, potentiometer 40 is set to bias the base of transistor 38 to a selected value. When the output signal of detector 34 goes about 0.6 volts below said selected value, transistors 38 turns on, thus preventing the output voltage from detector 34 from going lower, i.e., the output voltage is clamped.

FIG. 7a shows the implementation of the clamp circuit 7a as it is connected to the implementation of BPF 32. Clamp 36a comprises adjustable potentiometer 40 receiving +12 and −12 volts at respective ends and resistor 42 coupled to the top of potentiometer 40. Resistor 42 forms a voltage divider with internal resistors of BPF 32 (not shown in FIG. 2) and the input impedance of detector 34. BPF 32 is DC coupled to detector 34, and thus applies the potential at the lower end of resistor 42 to a biasing circuit within detector 34. This biases RMS detector 34 so that a control voltage for input signals having an RMS value lower than the predetermined level established by clamp 36a does not take place.

FIG. 8 shows the details of the expander shown in block form in FIG. 4 and also uses the 1252H2 and 1253H2 integrated circuits from NEC. Clamp circuit 76 is similar to clamp circuit 36 of the expander shown in FIG. 8 and operates in the same manner.

FIG. 8a shows how clamp circuit 76a is implemented and how it is connected to the implementation of BPF 72. Clamp circuit 76a is similar to clamp circuit 36a of the expander of FIG. 7a and operates in the same manner.

What is claimed is:

1. Apparatus for compressing an input signal comprising:
   a fixed preemphasis circuit receiving said input signal for emphasizing high frequency components of said input signal to produce a first output signal;
   a filter circuit including a first variable gain amplifier having an input coupled to said fixed preemphasis circuit for modifying the amplitude of the high frequency components of said first output signal in response to a first control signal to produce a second output signal;
   control means responsive to said second output signal for generating said first control signal;
   clamping means coupled to said control means and being responsive to the amplitude of a signal related to said second output signal being less than a predetermined threshold amplitude for limiting said first control signal so as to limit the amount of gain provided by said variable gain amplifier;
   a second variable gain amplifier coupled between said fixed preemphasis circuit and said filter circuit for modifying the amplitude of frequency components of said first output signal in a frequency range encompassing said high frequency components in response to a second control signal; and
   second control means responsive to said second output signal of said filter circuit for generating said second control signal; wherein
   each of said first and second control means comprises a bandpass filter and an RMS detector coupled in the order named between the output of said filter circuit and the respective variable gain amplifier; and
   said clamping means comprises biasing means coupled to said RMS detector of said first control means for disabling said RMS detector of said first control means from responding to signals from said bandpass filter below said predetermined threshold amplitude.

2. Apparatus for expanding an input signal comprising:
   a fixed deemphasis circuit receiving said input signal for deemphasizing high frequency components of said input signal to produce a first output signal;
   a filter circuit including a first variable gain amplifier modifying the amplitude of high frequency components of said first output signal in response to a first control signal to produce a second output signal;
   first control means responsive to said first output signal for generating said first control signal;
   clamping means, coupled to said control means and being responsive to the amplitude of a signal related to said first output signal being less than a predetermined threshold amplitude for limiting said first control signal so as to limit the amount of attenuation provided by said variable gain amplifier;
   a second variable gain amplifier coupled to the output of said first variable gain amplifier for modifying the amplitude of frequency components of said second output signal in a frequency range encompassing said high frequency components in response to a second control signal; and
   second control means responsive to said first output signal from said fixed deemphasis circuit for generating said second control signal; wherein
   each of said first and second control means comprises a bandpass filter and an RMS detector coupled in the order named between the output of said fixed deemphasis circuit and the respective variable gain amplifier; and
   said clamping means comprises biasing means coupled to said RMS detector of said first control means for disabling said RMS detector of said first control means from responding to signals from said bandpass filter below said predetermined threshold amplitude.

3. A channel for processing an audio signal comprising:
   fixed filter means for emphasizing high frequency components of said audio signal to produce a preemphasized audio signal;
   variable filter means for controlling between upper and lower gain limits the amplitude of said preemphasized audio signal in a first frequency range in response to a control signal;
   first control means for generating said first control signal; and
   clamp means coupled to said first control means for limiting the amplitude of said control signal so as to limit the control provided by said variable filter means to a range between said lower gain limit and a predetermined limit, less than said upper gain limit.

4. A channel for processing an audio signal comprising:
   fixed filter means for deemphasizing high frequency components of said audio signal to produce a deemphasized audio signal;
   variable filter means for controlling between upper and lower gain limits the amplitude of said deemphasized audio signal in a first frequency range in response to a control signal;
   first control means for generating said first control signal; and
   clamp means coupled to said first control means for limiting the amplitude of said control signal so as to limit the control provided by said variable filter means to a range between said upper gain limit and a predetermined limit, greater than said lower gain limit.

* * * * *